United States Patent
Yao

(10) Patent No.: US 9,746,832 B1
(45) Date of Patent: Aug. 29, 2017

(54) SYSTEM AND METHOD FOR TIME-TO-DIGITAL CONVERTER FINE-CONVERSION USING ANALOG-TO-DIGITAL CONVERTER (ADC)

(71) Applicant: Samsung Electronics Co., Ltd., Gyeonggi-do (KR)

(72) Inventor: Chih-Wei Yao, Sunnyvale, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/432,578

(22) Filed: Feb. 14, 2017

Related U.S. Application Data

(60) Provisional application No. 62/385,313, filed on Sep. 9, 2016.

(51) Int. Cl.
| | | |
|---|---|---|
| H03M 1/12 | (2006.01) |
| G04F 10/00 | (2006.01) |
| H03M 7/30 | (2006.01) |
| H03M 1/38 | (2006.01) |
| H03M 1/10 | (2006.01) |
| H03M 1/00 | (2006.01) |

(52) U.S. Cl.
CPC ........ *G04F 10/005* (2013.01); *H03M 1/1009* (2013.01); *H03M 1/38* (2013.01); *H03M 7/30* (2013.01); *H03M 1/00* (2013.01); *H03M 1/12* (2013.01); *H03M 2201/4233* (2013.01)

(58) Field of Classification Search
CPC ... H03M 1/12; H03M 1/00; H03M 2201/4233
USPC ................................ 341/155, 156, 120, 166
See application file for complete search history.

(56) References Cited

U.S. PATENT DOCUMENTS

| | | | |
|---|---|---|---|
| 7,932,847 B1 * | 4/2011 | Hsieh | G04F 10/005 341/155 |
| 8,331,520 B2 | 12/2012 | Ueda et al. | |
| 8,564,471 B1 | 10/2013 | Gao et al. | |
| 8,854,102 B2 | 10/2014 | Chaivipas et al. | |
| 8,890,738 B2 | 11/2014 | Kim et al. | |

(Continued)

OTHER PUBLICATIONS

S.S. Mohan, et al. Differential Ring Oscillators with Multipath Delay Stages, IEEE 2005 Custom Integrated Circuits Conference, pp. 503-506.

(Continued)

*Primary Examiner* — Joseph Lauture
(74) *Attorney, Agent, or Firm* — The Farrell Law Firm, P.C.

(57) ABSTRACT

An apparatus and a method. The apparatus includes a delay processor, a coarse converter and node selector connected to the delay processor and configured to select a first voltage $V_1$ and a second voltage $V_2$ of opposite polarities of adjacent stages of the delay processor, a fine converter connected to the coarse converter and node selector and configured to determine a zero-crossing time associated with the first voltage $V_1$ and the second voltage $V_2$; and an encoder connected to the coarse converter and the fine converter and configured to receive and encode the first voltage $V_1$, the second voltage $V_2$ and the zero-crossing time, wherein $V_1$ is a first negative voltage before the zero-crossing time, and $V_2$ is a first positive voltage after the zero-crossing time.

20 Claims, 7 Drawing Sheets

(56) References Cited

U.S. PATENT DOCUMENTS

| | | |
|---|---|---|
| 9,240,914 B2 | 1/2016 | Yao |
| 9,379,879 B1 | 6/2016 | Caffee et al. |
| 2016/0238998 A1 | 8/2016 | Pavlovic et al. |

OTHER PUBLICATIONS

Chih-Wei Yao, et al. A 2.8-3.2-GHz Fractional-N Digital PLL With ADC-Assisted TDC and Inductively Coupled Fine-Tuning DCO, IEEE Journal of Solid-State Circuits, vol. 48, No. 3, Mar. 2013.

Seog-Jun Lee, et al. A Novel High-Speed Ring Oscillator for Multiphase Clock Generation Using Negative Skewed Delay Scheme, IEEE Journal of Solid-State Circuits, vol. 32, No. 2, Feb. 1997.

Ko, CHi-Tung, High-resolution Multi-stage, Time-to-digital Converters, Dissertation through The Chinese University of Hong Kong, ProQuest LLC, Apr. 2013, pp. 1-147.

\* cited by examiner

US 9,746,832 B1

SYSTEM AND METHOD FOR TIME-TO-DIGITAL CONVERTER FINE-CONVERSION USING ANALOG-TO-DIGITAL CONVERTER (ADC)

PRIORITY

This application claims priority under 35 U.S.C. §119(e) to a U.S. Provisional Patent Application filed on Sep. 9, 2016 in the United States Patent and Trademark Office and assigned Ser. No. 62/385,313, the entire contents of which are incorporated herein by reference.

FIELD

The present disclosure relates generally to electronic circuits, and more particularly, to a system and method for time-to-digital converter (TDC) fine conversion using an analog-to-digital converter (ADC).

BACKGROUND

A TDC is a device that provides a digital representation of a time duration at which an event occurs. A TDC determines an interval of time between two signal pulses (e.g., a start pulse and a stop pulse).

The resolution of a conventional TDC is limited to a propagation delay time of an element (e.g., a buffer and an inverter) used in the TDC to determine a digital representation of a time duration at which an event occurs. However, a resolution based on the propagation delay time of an element may be insufficient for certain wireless communication applications.

SUMMARY

According to one embodiment, an apparatus includes a delay processor; a coarse converter and node selector connected to the delay processor and configured to select a first voltage $V_1$ and a second voltage $V_2$ of opposite polarities of adjacent stages of the delay processor; a fine converter connected to the coarse converter and node selector and configured to determine a zero-crossing time associated with the first voltage $V_1$ and the second voltage $V_2$; and an encoder connected to the coarse converter and the fine converter and configured to receive and encode the first voltage $V_1$, the second voltage $V_2$ and the zero-crossing time, wherein $V_1$ is a first negative voltage before the zero-crossing time, and $V_2$ is a first positive voltage after the zero-crossing time.

According to one embodiment, a method includes generating, by a delay processor, a delayed signal; selecting, by a coarse converter and node selector, a first voltage $V_1$ and a second voltage $V_2$ of opposite polarities of adjacent stages of the delay processor; determining, by a fine converter connected to the coarse converter and node selector, a zero-crossing time associated with the first voltage $V_1$ and the second voltage $V_2$; and encoding, by an encoder connected to the coarse converter and the fine converter, the first voltage $V_1$, the second voltage $V_2$, and the zero-crossing time, wherein $V_1$ is a first negative voltage before the zero-crossing time, and $V_2$ is a first positive voltage after the zero-crossing time.

According to one embodiment, a method of manufacturing a TDC, including forming the TDC on a wafer or a package with at least one other TDC, wherein the TDC includes a delay processor; a coarse converter and node selector connected to the delay processor and configured to select a first voltage $V_1$ and a second voltage $V_2$ of opposite polarities of adjacent stages of the delay processor; a fine converter connected to the coarse converter and node selector and configured to determine a zero-crossing time associated with the first voltage $V_1$ and the second voltage $V_2$; and an encoder connected to the coarse converter and the fine converter and configured to receive and encode the first voltage $V_1$, the second voltage $V_2$ and the zero-crossing time, wherein $V_1$ is a first negative voltage before the zero-crossing time, and $V_2$ is a first positive voltage after the zero-crossing time; and testing the TDC, wherein testing the TDC comprises testing the TDC using one or more electrical to optical converters, one or more optical splitters that split an optical signal into two or more optical signals, and one or more optical to electrical converters.

According to one embodiment, a method of constructing an integrated circuit includes generating a mask layout for a set of features for a layer of the integrated circuit, wherein the mask layout includes standard cell library macros for one or more circuit features that include a TDC including a delay processor; a coarse converter and node selector connected to the delay processor and configured to select a first voltage $V_1$ and a second voltage $V_2$ of opposite polarities of adjacent stages of the delay processor; a fine converter connected to the coarse converter and node selector and configured to determine a zero-crossing time associated with the first voltage $V_1$ and the second voltage $V_2$; and an encoder connected to the coarse converter and the fine converter and configured to receive and encode the first voltage $V_1$, the second voltage $V_2$ and the zero-crossing time, wherein $V_1$ is a first negative voltage before the zero-crossing time, and $V_2$ is a first positive voltage after the zero-crossing time; disregarding relative positions of the macros for compliance to layout design rules during the generation of the mask layout; checking the relative positions of the macros for compliance to layout design rules after generating the mask layout; upon detection of noncompliance with the layout design rules by any of the macros, modifying the mask layout by modifying each of the noncompliant macros to comply with the layout design rules; generating a mask according to the modified mask layout with the set of features for the layer of the integrated circuit; and manufacturing the integrated circuit layer according to the mask.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
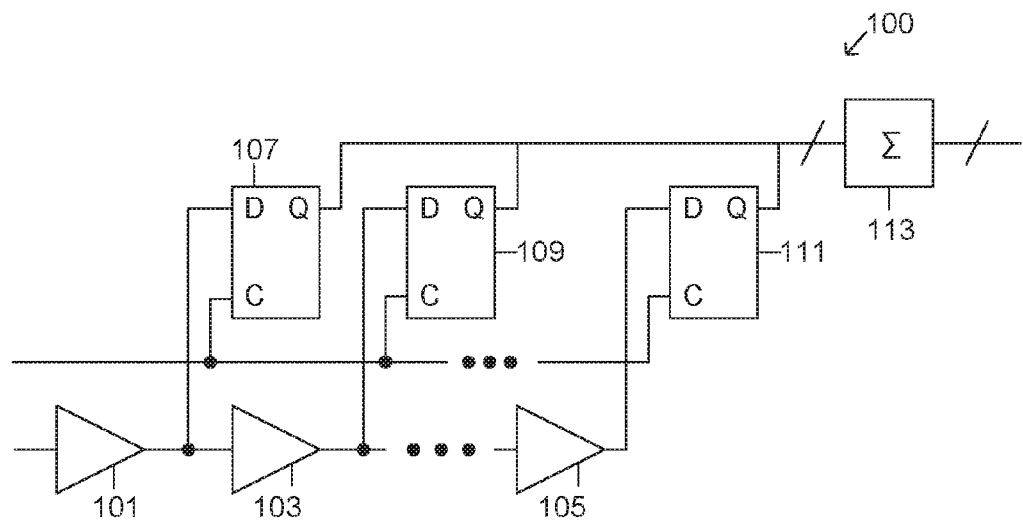
FIG. 1 illustrates an exemplary block diagram of a delay line TDC, according to one embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

FIG. 1 illustrates an exemplary block diagram of a delay line TDC, according to one embodiment. A TDC 100 includes a plurality of delay elements 101, 103, and 105 (e.g., a buffer, an inverter), a plurality of flip-flops 107, 109, and 111, and a summation function block 113. It is understood that the TDC 100 may include any number of delay elements and corresponding flip-flops, without deviating from the scope of the present disclosure.

Referring to FIG. 1, the plurality of delay elements 101, 103, and 105 are serially connected to form a delay line, where the first delay element 101 receives an input signal (e.g., a START signal). Each output of the plurality of delay elements 101, 103, and 105 is connected to a corresponding D-input of one corresponding flip-flop of the plurality of flip-flops 107, 109, and 111. A second signal (e.g., a STOP signal) is connected to each clock input of the plurality of flip-flops 107, 109, and 111. Q outputs of the plurality of flip-flops 107, 109, and 111 are connected to the summation function block 113 via a bus.

In the delay line TDC 100 shown in FIG. 1, all of the plurality of flip-flops 107, 109, and 111 are reset to logic-0 before operating (e.g., starting) the TDC and measuring the outputs of the plurality of flip-flops 107, 109, and 111. Measurement of the plurality of flip-flops 107, 109, and 111 begins at the rising edge of the START signal and ends at the rising edge of the STOP signal. The TDC 100 reports a digital value that is proportional to the timing difference between the rising edges of the START and the STOP signals. The START signal propagates along the delay line formed by the plurality of buffers 101, 103, and 105 to generate delayed versions of the START signal at each of the outputs of the plurality of buffers, respectively (e.g., $V_1$, $V_2$, and $V_3$). At the rising edge of the STOP signal, the plurality of flip-flops 107, 109, and 111 store and output the corresponding outputs values of the plurality of buffers 101, 103, and 105 (e.g., $V_1$, $V_2$, and $V_3$). The outputs of the plurality of flip-flops 107, 109, and 111 are provided to the summation function block 113. The output of the summation function block 113 TDC is the sum of the outputs of the plurality of flip-flops 107, 109, and 111.

The larger the timing difference between the rising edge of the START signal and the rising edge of the STOP signal, the more logic-1's are stored and output by the plurality of flip-flops 107, 109, and 111. With N delay elements and N corresponding flip-flops, a delay line TDC can report a digital output value between 0 to N. The propagation delay for each of the plurality of delay elements 101, 103, and 105 is $\tau$. Thus, a delay line TDC can measure time between 0 and N$\tau$.

In a 65 nanometer (nm) complementary metal oxide semiconductor (CMOS) process, an inverter has a propagation delay of approximately 20 picoseconds (ps), which limits the resolution of a delay line TDC to approximately 40 ps, since two inverters are typically used to form a delay element that includes a buffer. Alternatively, a TDC may use an inverter as a delay element, which improves the resolution to approximately 20 ps. However, a 20 ps resolution may still be insufficient for certain wireless communication applications.

The present disclosure improves the resolution of a TDC by a two-step conversion code process, where the first step is a coarse conversion code step, and the second step if a fine conversion code step. In the two-step conversion code process, a first-stage TDC generates a coarse conversion code and sets residual analog voltages that contain detailed timing information that is not captured by the coarse conversion code. At least two of the residual analog voltages are selected based on the coarse conversion code. At least two ADCs used in parallel, or one ADC used in serial fashion, convert the selected residual analog voltages to digital values. A fine conversion code is calculated based on the outputs from the at least one ADCs, and the coarse conversion code and the fine conversion code are encoded to generate an improved resolution output of the TDC.

Figure 2:
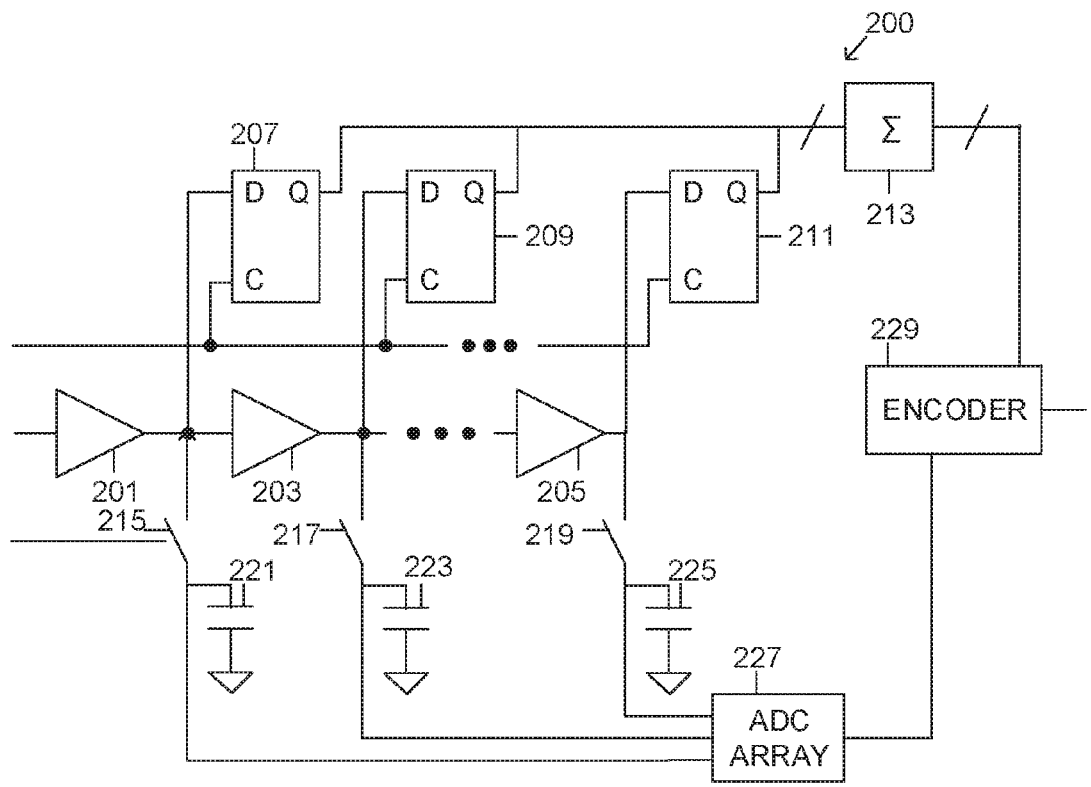
FIG. 2 illustrates an exemplary block diagram of an analog-to-digital-converter (ADC) assisted TDC, according to one embodiment.

FIG. 2 illustrates an exemplary block diagram of an analog-to-digital-converter (ADC) assisted TDC, according to one embodiment. Since the outputs of a delay line have finite rise and fall times, the outputs of the delay line are sampled and converted to digital values to improve TDC resolution. A TDC 200 includes a plurality of delay elements 201, 203, and 205 (e.g., a buffer, an inverter), a plurality of flip-flops 207, 209, and 211, a summation function block 213, a plurality of switches 215, 217, and 219, a plurality of capacitors 221, 223, and 225, an ADC array 227, and an encoder 229. It is understood that the TDC 200 may include any number of delay elements and corresponding flip-flops and capacitors, without deviating from the scope of the present disclosure.

Referring to FIG. 2, the plurality of delay elements 201, 203, and 205 are serially connected to form a delay line. The first delay element 201 receives an input signal (e.g., a START signal). Each output of the plurality of delay elements 201, 203, and 205 is connected to a corresponding D-input of one of the plurality of flip-flops 207, 209, and 211. A second signal (e.g., a STOP signal) is connected to each clock input of the plurality of flip-flops 207, 209, and 211. Q outputs of the plurality of flip-flops 207, 209, and 211 are connected to the summation function block 213 via a bus. Each of the plurality of switches 215, 217, and 219 is connected between a corresponding output of the respective delay elements 201, 203, and 205, and a first terminal of a respective one of the plurality of capacitors 221, 223, and 225. A second terminal of each of the plurality of capacitors 221, 223, and 225 is connected to a ground potential. The first terminal of each of the plurality of capacitors 221, 223, and 225 is connected to the ADC array 227. The outputs of the ADC array 227 and the summation function block 213 are connected to the encoder 229, where the output of the encoder is the output of the ADC-assisted TDC 200.

Figure 3:
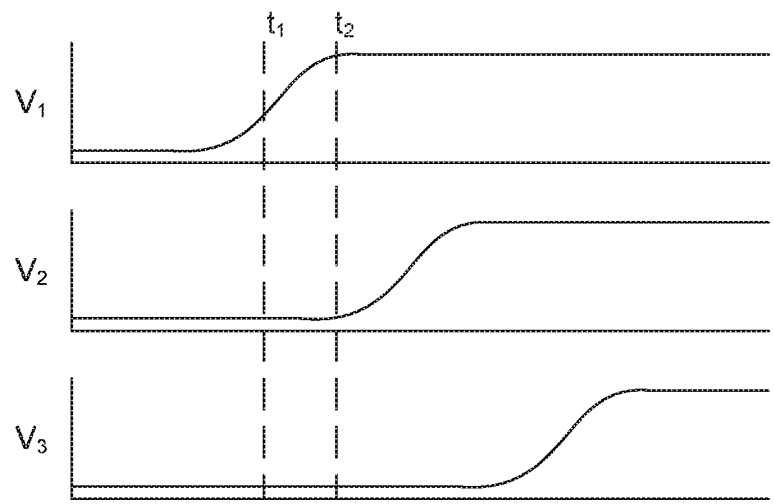
FIG. 3 illustrates an exemplary plot of voltage waveforms of buffers in a TDC, according to one embodiment.

FIG. 3 illustrates an exemplary plot of voltage waveforms of buffers in a TDC, according to one embodiment.

Referring to FIG. 3, simulated waveforms of three output voltages $V_1$, $V_2$, and $V_3$ of a delay line are illustrated, where each delay element includes two inverters. If the delay line output nodes are sampled at time $t_1$, $V_1$ provides voltage information that may be used to improve the TDC resolution. However, $V_2$ and $V_3$ are close to 0 V at time $t_1$ and, therefore, do not provide voltage information that is useful for improving TDC resolution. If the delay line is sampled at time $t_2$, $V_1$ is close to the supply voltage, and $V_2$ and $V_3$ are close to 0 V. Therefore, none of the voltages $V_1$, $V_2$ and $V_3$ provides voltage information at time $t_2$ that may be used to improve TDC resolution. Thus, a two-inverter delay element may not be suitable to implement an ADC-assisted TDC.

Figure 4:
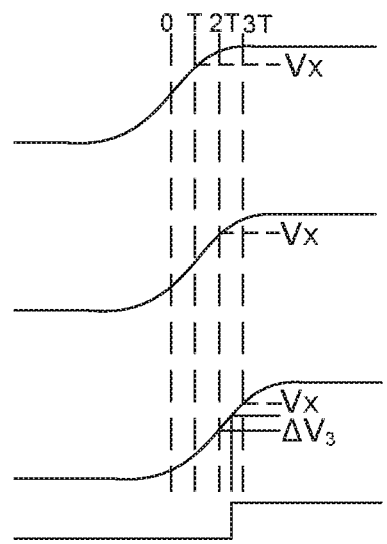
FIG. 4 illustrates an exemplary plot of overlapping voltage waveforms of buffers in a TDC, according to one embodiment.

FIG. 4 illustrates an exemplary plot of overlapping voltage waveforms of buffers in a TDC, according to one embodiment.

Referring to FIG. 4, the waveforms of outputs of a delay line are illustrated to provide sufficient overlap between the rising and falling transitions of the waveforms of adjacent delay line outputs. Thus, the waveforms illustrated in FIG. 4 provide voltage information that is suitable for an ADC-assisted TDC. At any sampling time, at least one of the sampled output voltages would have a non-saturated voltage value that provides timing information that is useful for improving the resolution of a TDC. Furthermore, with relatively slow rise and fall times as compared to TDC resolution, it is possible to find a linear ramping segment in each of the waveforms. The voltage waveform $V_1$ has a linear segment between time 0 and time T, and has a voltage of $V_x$ at the end of the linear segment. The voltage waveform $V_2$ has a linear segment between time T and time 2T, and has a voltage of $V_x$ at the end of the linear segment. The voltage waveform $V_3$ has a linear segment between time 2T and time 3T, and has a voltage of $V_x$ at the end of the linear segment. A STOP signal switches from 0 volts (0 V) to a supply voltage between time 2T and time 3T. The voltage difference between the start of the linear segment of waveform $V_3$ and the time at which the STOP signal switches from 0 V to the supply voltage is $\Delta V_3$. Thus, the time from time 0 to when the STOP signal switches from 0 V to the supply voltage is equal to 2T plus the result of dividing $\Delta V_3$ by the slope of the linear segment of the waveform $V_3$.

Figure 5:
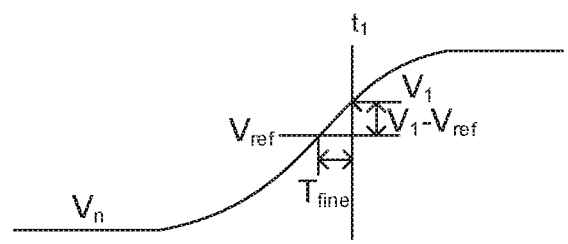
FIG. 5 illustrates an exemplary plot of a voltage waveform from a TDC that identifies a fine resolution time, according to one embodiment.

FIG. 5 illustrates an exemplary plot of a voltage waveform from a TDC that identifies a fine resolution time, according to one embodiment. To translate a sampled voltage to a time, an offset voltage is removed from the sampled voltage and the result is scaled by 1/Slope as shown in FIG. 5, where Slope is the slope of the linear segment of $V_1$. If the sampled voltage is $V_1$ and the offset voltage is $V_{ref}$, the fine-conversion time is as expressed in Equation (1) as follows:

$$T_{fine} = (V_1 - V_{ref})/\text{Slope} \quad (1)$$

Equation (1) above requires the knowledge of Slope, which has conventionally been determined using approaches such as calibration. To avoid the complexity of performing a calibration, the present disclosure utilizes two sampled voltages.

Figure 6:
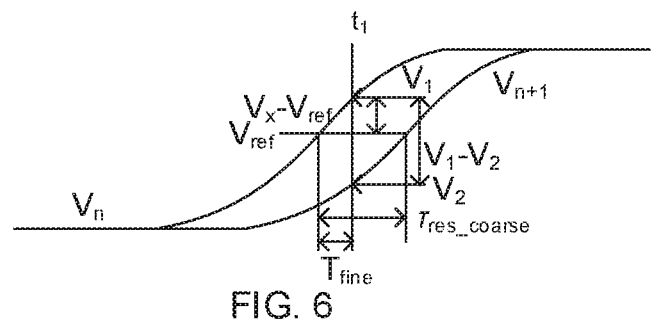
FIG. 6 illustrates an exemplary plot of a pair of voltage waveforms from a TDC that is sampled to generate a fine conversion code, according to one embodiment.

FIG. 6 illustrates an exemplary plot of a pair of voltage waveforms from a TDC that is sampled to generate a fine conversion code, according to one embodiment.

Referring to FIG. 6, a pair of waveforms $V_n$ and $V_{n+1}$ are illustrated. Waveform $V_{n+1}$ is a delayed version of waveform $V_n$. These waveforms may be generated from a delay line or a ring oscillator. A number of waveforms are available from the outputs of a delay line or a ring oscillator, and a coarse conversion code is employed to select two waveforms from the outputs of a delay line or ring oscillator for determining a fine conversion code. For an accurate fine conversion code, $V_n$ and $T_{n+1}$ waveform transition times must be greater than a relative propagation delay between waveforms $V_n$ and $V_{n+1}$. At time $t_1$, waveforms $V_n$ and $V_{n+1}$ are sampled. A slope may be calculated as $(V_1-V_2)/\tau\text{res\_coarse}$, where $\tau\text{res\_coarse}$ is a coarse resolution for the TDC. Therefore, a fine conversion time for the TDC may be expressed as in Equation (2) as follows:

$$T_{fine} = ((V_1 - V_{ref})/(V_1 - V_2)) \times \tau\text{res\_coarse} \quad (2)$$

Fine conversion timing is represented relative to the coarse-conversion resolution $\tau\text{res\_coarse}$. $\tau\text{res\_coarse}$ may be evaluated based on a background calibration technique. Therefore, the present disclosure improves TDC resolution without requiring calibration for the fine converter.

If $(V_1-V_2)$ is nearly constant for different samples of a delay line or a ring oscillator, a constant value may be assumed for an offset time τ. Thus, Equation (2) above may be expressed as in Equation (3) as follows:

$$\tau_{fine}=(V_1/(V_1-V_2))\times\tau_{res\_coarse}-\tau \quad (3)$$

Figure 7:
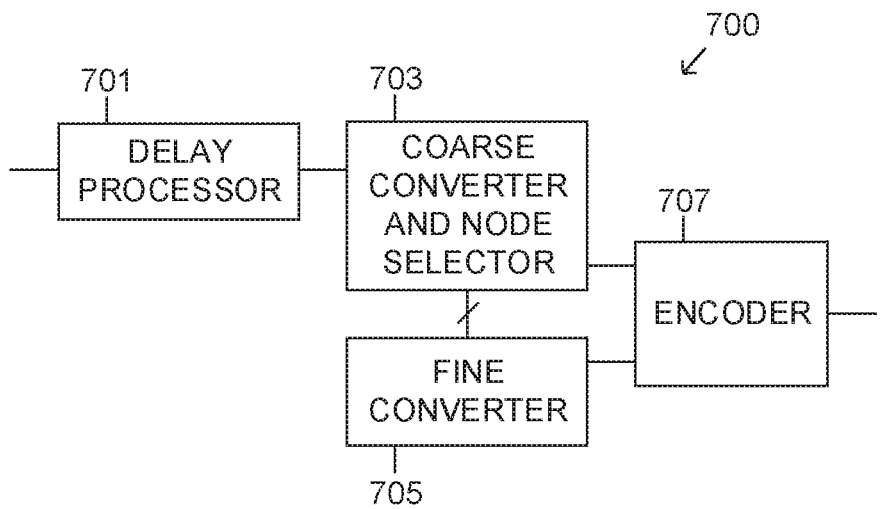
FIG. 7 illustrates an exemplary block diagram of the present TDC, according to one embodiment.

FIG. 7 illustrates an exemplary block diagram of the present TDC, according to one embodiment.

Referring to FIG. 7, a TDC 700 includes a delay processor 701, a coarse converter and node selector 703, a fine converter 705, and an encoder 707. The coarse converter and node selector 703 and the fine converter 705 reduces TDC quantization noise and, thus, increases TDC resolution.

The delay processor 701 receives an input signal (e.g., a START signal) and produces a plurality of delayed versions of the input signal. The delay processor may be a delay line or a ring oscillator. However, the present disclosure is not limited to using either a delay line or a ring oscillator as the delay processor 701.

The coarse converter and node selector 703 is connected to the delay processor 701 and receives the outputs of the delay processor 701. The coarse converter and node selector 703 employs a multi-stage delay element (e.g., a delay line, a ring oscillator). Before starting measurements, the outputs of the delay element is reset to pre-determined voltages. A resistor ladder may be used to reset the delay element. However, the present disclosure is not limited thereto. An interpolated ring oscillator may be employed to ensure oscillation waveforms suitable for fine conversion. An enable (EN) signal may be employed to start operation of the delay element (e.g., when EN goes high). Pulses generated by the delay element may be counted by a digital counter. When EN goes low, the delay element may be disconnected from a supply voltage and a ground potential to store the output voltages of the delay element. The coarse converter and node selector 703 generates a plurality of differential voltages for the outputs of the delay element. A plurality of buffers together with a resistor ring may be employed to generate the differential voltages. The coarse converter and node selector 703 includes a plurality of comparators to determine the state of the output voltages of the delay element to within 1/n of the propagation delay of the delay element, where n is the number of elements in the delay element. If the delay element is a ring oscillator, the plurality of comparators determine the phase of the ring oscillator to within 1/n of the ring oscillator period. Each of the output voltages of a ring oscillator resembles a periodic function. The coarse converter and node selector 703 selects a plurality of output voltages (e.g., 2) of the delay processor 701. However, the present disclosure is not limited to selecting 2 output voltages. In addition, the selected output voltages may be selected that include a zero-crossing point. However, the present disclosure is not limited to including a zero-crossing point.

The fine converter 705 is connected to the coarse converter and node selector 703 to receive the output voltages selected from the delay processor 701 and the corresponding differential voltages. The fine converter 705 converts the selected output voltages to digital voltages using at least one ADC (e.g., a plurality of ADCs for parallel processing or a single ADC for serial processing). The ADC may be implemented as a successive approximation register ADC (SAR ADC). The fine converter 705 determines a fine conversion code by interpolating a time (e.g., the zero-crossing time).

The output of the at least one ADC (e.g., at least one SAR ADC) is $V_1$ and $V_2$, and the time (e.g., the zero-crossing time) may be calculated as $((V_1-V_{ref})/(V_1-V_2))\times$ τres_coarse.

The encoder 707 is connected to the outputs of the coarse converter and node selector 703 and the fine converter 705. The encoder 707 receives the coarse conversion code of the TDC 700 from the coarse converter and node selector 703 and receives the fine conversion time of the TDC 700 from the fine converter 705. The encoder 707 encodes the coarse conversion code and the fine conversion time to improve the resolution of the TDC 700. For example, for a 13-stage ring oscillator with an oscillation period of 120 ps and a pair of 7-bit ADCs, the resolution of the TDC 700 is improved to about 0.2 ps.

Figure 8:
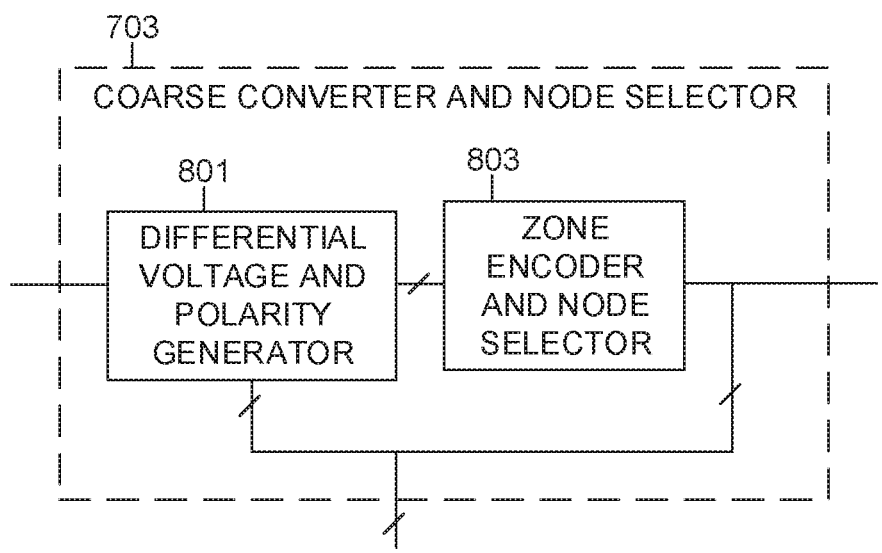
FIG. 8 illustrates an exemplary block diagram of a coarse converter and node selector, according to one embodiment.

FIG. 8 illustrates an exemplary block diagram of a coarse converter and node selector, according to one embodiment.

Referring to FIG. 8, the coarse converter and node selector 703 includes a differential voltage and polarity generator 801 and a zone encoder and node selector 803.

The differential voltage and polarity generator 801 includes an input for receiving the output voltages of the delay processor 701, a first output, and a second output. The differential voltage and polarity generator 801 generates differential voltages of the output voltages of the delay processor 701, which are provided at the first output. A resistive averaging string may be used to generate the differential voltages. The differential voltage and polarity generator 801 includes a plurality of comparators for comparing the output voltages of the delay processor 701 against the generated differential voltages, where the polarities of generated differential voltages are provided at the second output.

The zone encoder and node selector 803 receives the polarities of the generated differential voltages from the differential voltage and polarity generator 801, determines a coarse conversion code for the TDC 700, and selects a plurality (e.g., 2) of the outputs of the delay processor 701 to be used to determine the fine conversion time of the TDC 700, which are provided at the output of the coarse converter and node selector 703. The two outputs selected may be adjacent outputs of the delay processor 701 that include a zero-crossing of the corresponding output voltages. However, the present disclosure is not limited to selecting two outputs of the delay processor 701 or selecting outputs of the delay processor 701 that include a zero-crossing of the corresponding output voltages.

Figure 9:
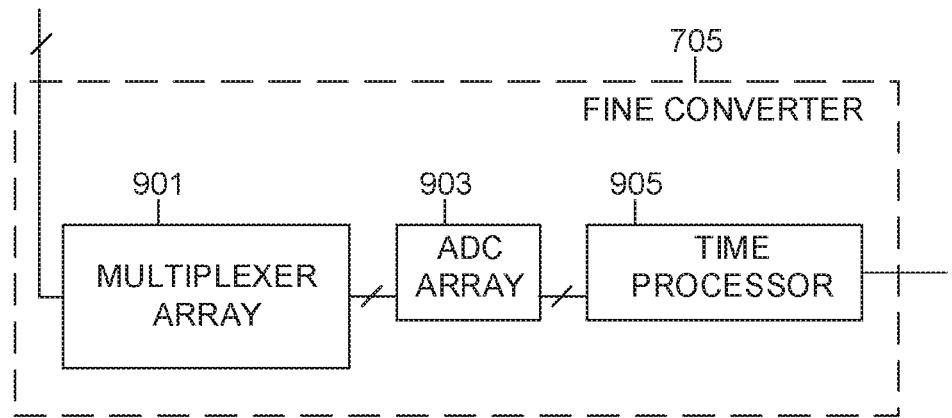
FIG. 9 illustrates an exemplary block diagram of a fine converter, according to one embodiment.

FIG. 9 illustrates an exemplary block diagram of a fine converter, according to one embodiment.

Referring to FIG. 9, the fine converter 705 includes a multiplexer array 901, an ADC array 903, and a time processor 905.

The multiplexer array 901 includes an input for receiving the output voltages of the delay processor 701, the differential voltages generated from the output voltages of the delay processor 701, and the outputs selected from the delay processor 701, and an output.

The ADC array 903 is connected to the output of the multiplexer array 901 for receiving the selected outputs and their corresponding differential voltages. The ADC array 903 may include an ADC (e.g., an SAR ADC) for each output voltage processed or may include one ADC for serially processing the output voltages. The ADC array 903 generates two voltages $V_1$ and $V_2$.

The time processor 905 receives $V_1$ and $V_2$ from the ADC array 903 and calculates a time (e.g., a time at which a zero-crossing occurs between the two selected outputs). The time may be calculated as $((V_1-V_{ref})/(V_1-V_2)) \times \tau_{res\_coarse}$. The calculated time is provided at the output of the fine converter 705.

Figure 10:
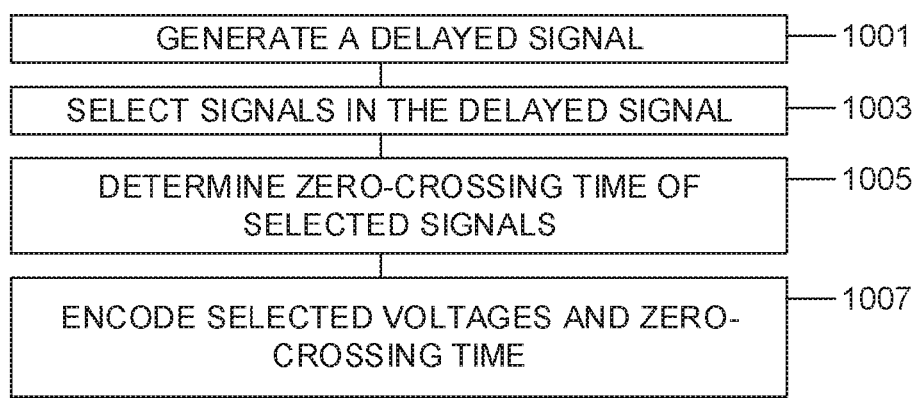
FIG. 10 illustrates an exemplary flowchart for the present TDC fine conversion, according to one embodiment.

FIG. 10 illustrates an exemplary flowchart the present TDC fine conversion, according to one embodiment.

Referring to FIG. 10, a delayed signal is generated by a delay processor at 1001. The delayed signal may be generated by a delay line or a ring oscillator, according to one embodiment.

At 1003, a first voltage $V_1$ and a second voltage $V_2$ of opposite polarities of adjacent stages of the delay processor are selected by a coarse converter and node selector.

At 1005, a fine converter connected to the coarse converter and node selector determines a zero-crossing time associated with the first voltage $V_1$ and the second voltage $V_2$.

At 1007, an encoder connected to the coarse converter and the fine converter encodes the first voltage $V_1$, the second voltage $V_2$, and the zero-crossing time.

Figure 11:
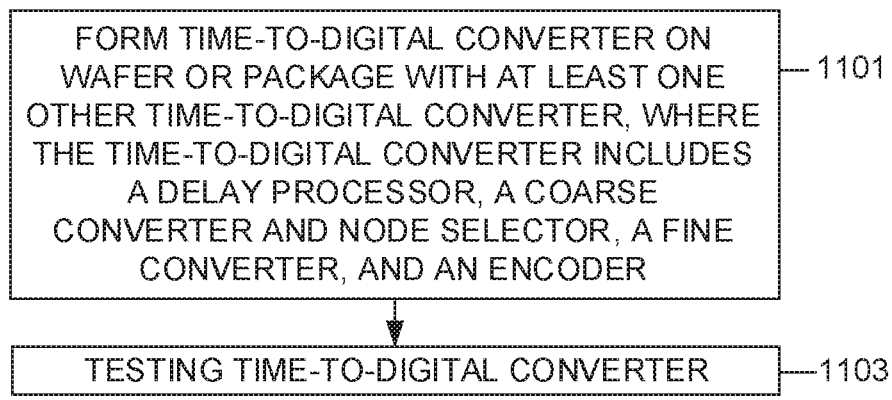
FIG. 11 illustrates an exemplary flowchart for manufacturing the present TDC, according to one embodiment.

FIG. 11 illustrates an exemplary flowchart for manufacturing the present TDC, according to one embodiment.

Referring to FIG. 11, a TDC is formed on a wafer or a package with at least one other TDC, where the TDC includes a delay processor; a coarse converter and node selector connected to the delay processor and configured to select a first voltage $V_1$ and a second voltage $V_2$ of opposite polarities of adjacent stages of the delay processor; a fine converter connected to the coarse converter and node selector and configured to determine a zero-crossing time associated with the first voltage $V_1$ and the second voltage $V_2$; and an encoder connected to the coarse converter and the fine converter and configured to receive and encode the first voltage the second voltage $V_2$ and the zero-crossing time at 1101.

At 1102, the TDC is tested. Testing the TDC may include testing the TDC using one or more electrical to optical converters, one or more optical splitters that split an optical signal into two or more optical signals, and one or more optical to electrical converters.

Figure 12:
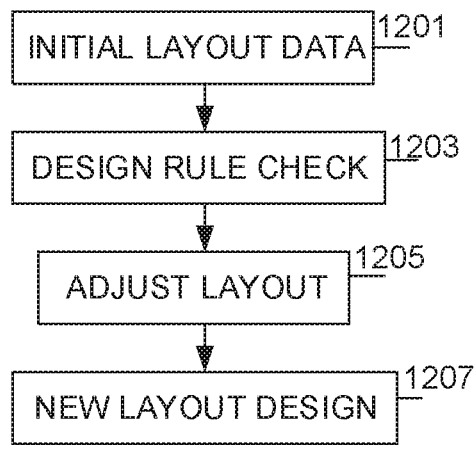
FIG. 12 illustrates an exemplary flowchart for constructing an integrated circuit, according to one embodiment.

FIG. 12 illustrates an exemplary flowchart for constructing an integrated circuit, according to one embodiment.

Referring to FIG. 12, initial layout data is constructed at 1201. For example, a mask layout is generated for a set of features for a layer of the integrated circuit, wherein the mask layout includes standard cell library macros for one or more circuit features that include a TDC that includes a delay processor; a coarse converter and node selector connected to the delay processor and configured to select a first voltage $V_1$ and a second voltage $V_2$ of opposite polarities of adjacent stages of the delay processor; a fine converter connected to the coarse converter and node selector and configured to determine a zero-crossing time associated with the first voltage $V_1$ and the second voltage $V_2$; and an encoder connected to the coarse converter and the fine converter and configured to receive and encode the first voltage $V_1$, the second voltage $V_2$ and the zero-crossing time, and disregarding relative positions of the macros for compliance to layout design rules during the generation of the mask layout.

At 1203, a design rule check is performed. For example, the method may check the relative positions of the macros for compliance to layout design rules after generating the mask layout.

At 1205, the layout is adjusted. For example, the method, upon detection of noncompliance with the layout design rules by any of the macros, may modify the mask layout by modifying each of the noncompliant macros to comply with the layout design rules.

At 1207, new layout data is generated. For example, the method may generate a mask according to the modified mask layout with the set of features for the layer of the integrated circuit. Then, the integrated circuit layer according to the mask may be manufactured.

Figure 13:
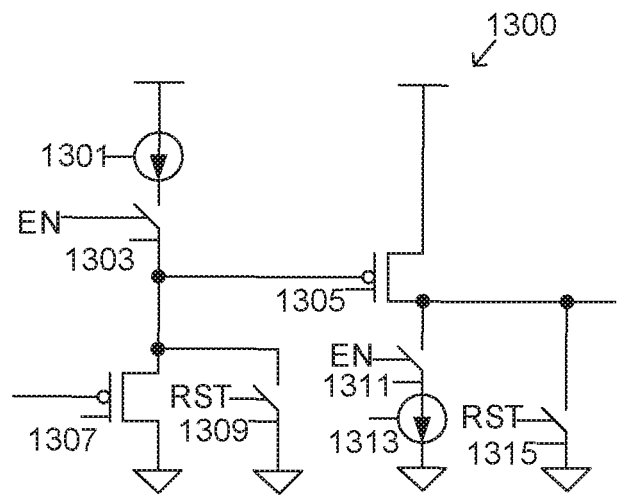
FIG. 13 illustrates an exemplary schematic diagram of a delay element, according to one embodiment.

FIG. 13 is an illustration of a schematic diagram of a delay element, according to one embodiment.

Referring to FIG. 13, a delay element 1300 includes a first current source 1301, a first switch 1303, an n-channel metal oxide semiconductor field effect transistor (NMOSFET) 1305, a p-channel metal oxide semiconductor field effect transistor (PMOSFET) 1307, a second switch 1309, a third switch 1311, a second current source 1313, and a fourth switch 1315.

The first current source 1301 includes a first terminal connected to a power supply voltage and a second terminal. The first switch 1303 includes a first terminal connected to the second terminal of the first current source 1301, a second terminal, and an enable input for receiving an enable signal.

The NMOSFET 1305 includes a drain connected to the power supply voltage, a gate connected to the second terminal of the first switch 1303, and a source connected to an output of the delay element 1300. The PMOSFET 1307 includes a drain connected to a ground potential, a gate for receiving an input to the delay element, and a source connected to the second terminal of the first switch 1303.

The second switch 1309 includes a first terminal connected to the source of the PMOSFET 1307, a second terminal connected to the ground potential, and a reset input for receiving a reset signal. The third switch 1311 includes a first terminal connected to the source of the NMOSFET 1305, a second terminal, and an enable input for receiving the enable signal.

The second current source 1313 includes a first terminal connected to the second terminal of the third switch 1311 and a second terminal connected to the ground potential. The fourth switch 1315 includes a first terminal connected to the source of the NMOSFET 1305, a second terminal connected to the ground potential, and a reset input for receiving the reset signal.

Figure 14:
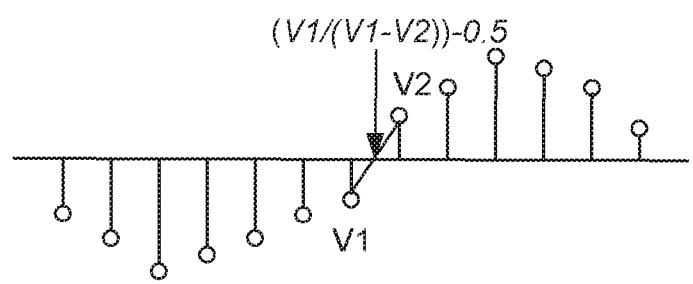
FIG. 14 illustrates an exemplary plot of a zero-crossing between two voltages, according to one embodiment.

FIG. 14 illustrates an exemplary plot of a zero-crossing between two voltages, according to one embodiment.

Referring to FIG. 14, the exemplary plot illustrates 13 voltages, where the first 7 voltages are negative and the last 6 voltages are positive. Thus, a zero-crossing point is between the seventh voltage and the eighth voltage, where the voltage in one embodiment may be represented as $(V_1/(V_1-V_2))-0.5$, where $V_1$ is a first negative voltage before the zero-crossing time, and $V_2$ is a first positive voltage after the zero-crossing time.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:
1. An apparatus, comprising:
   a delay processor;
   a coarse converter and node selector connected to the delay processor and configured to select a first voltage

$V_1$ and a second voltage $V_2$ of opposite polarities of adjacent stages of the delay processor;

a fine converter connected to the coarse converter and node selector and configured to determine a zero-crossing time associated with the first voltage $V_1$ and the second voltage $V_2$; and an encoder connected to the coarse converter and the fine converter and configured to receive and encode the first voltage $V_1$, the second voltage $V_2$ and the zero-crossing time, wherein $V_1$ is a first negative voltage before the zero-crossing time, and $V_2$ is a first positive voltage after the zero-crossing time.

2. The apparatus of claim 1, wherein the delay processor is one of a delay line and a ring oscillator.

3. The apparatus of claim 2, wherein a delay element in the delay line comprises:
a first current source that includes a first terminal connected to a power supply voltage and a second terminal;
a first switch that includes a first terminal connected to the second terminal of the first current source, a second terminal, and an enable input for receiving an enable signal;
an n-channel metal oxide semiconductor field effect transistor (NMOSFET) that includes a drain connected to the power supply voltage, a gate connected to the second terminal of the first switch, and a source connected to an output of the delay element;
a p-channel metal oxide semiconductor field effect transistor (PMOSFET) that includes a drain connected to a ground potential, a gate for receiving an input to the delay element, and a source connected to the second terminal of the first switch;
a second switch that includes a first terminal connected to the source of the PMOSFET, a second terminal connected to the ground potential, and a reset input for receiving a reset signal;
a third switch that includes a first terminal connected to the source of the NMOSFET, a second terminal, and an enable input for receiving the enable signal;
a second current source that includes a first terminal connected to the second terminal of the third switch and a second terminal connected to the ground potential; and
a fourth switch that includes a first terminal connected to the source of the NMOSFET, a second terminal connected to the ground potential, and a reset input for receiving the reset signal.

4. The apparatus of claim 1, wherein the coarse converter and node selector is comprised of:
a differential voltage and polarity generator; and
a zone encoder and node selector connected to the differential voltage and polarity generator.

5. The apparatus of claim 4, wherein the differential voltage and polarity generator is comprised of a resistive averaging string.

6. The apparatus of claim 1, wherein the fine converter is comprised of:
a multiplexer array;
an analog-to-digital (ADC) array connected to the multiplexer array; and
a time processor connected to the ADC array.

7. The apparatus of claim 6, wherein the ADC array is comprised of a first successive approximation ADC (SAR ADC) and a second SAR ADC.

8. The apparatus of claim 6, wherein the time processor calculates a time for the zero-crossing of the first voltage $V_1$ and the second voltage $V_2$ of the delay processor as $((V_1-V_{ref})/(V_1-V_2)) \times \tau_{res\_coarse}$, wherein $V_{ref}$ is an offset voltage and $\tau_{res\_coarse}$ is a coarse conversion resolution.

9. The apparatus of claim 6, wherein the time processor calculates a time for the zero-crossing of the first voltage $V_1$ and the second voltage $V_2$ of the delay processor as $(V_1/(V_1-V_2)) \times \tau_{res\_coarse} - \tau$, wherein $V_{ref}$ is an offset voltage, $\tau_{res\_coarse}$ is a coarse conversion resolution, and $\tau$ is an offset time.

10. A method, comprising:
generating, by a delay processor, a delayed signal;
selecting, by a coarse converter and node selector, a first voltage $V_1$ and a second voltage $V_2$ of opposite polarities of adjacent stages of the delay processor;
determining, by a fine converter connected to the coarse converter and node selector, a zero-crossing time associated with the first voltage $V_1$ and the second voltage $V_2$; and
encoding, by an encoder connected to the coarse converter and the fine converter, the first voltage $V_1$, the second voltage $V_2$, and the zero-crossing time, wherein $V_1$ is a first negative voltage before the zero-crossing time, and $V_2$ is a first positive voltage after the zero-crossing time.

11. The method of claim 10, wherein the delayed signal is generated by one of a delay line and a ring oscillator.

12. The method of claim 11, wherein the delayed signal is generated by the delay line, wherein the delay line includes at least one delay element comprising:
a first current source that includes a first terminal connected to a power supply voltage and a second terminal;
a first switch that includes a first terminal connected to the second terminal of the first current source, a second terminal, and an enable input for receiving an enable signal;
an n-channel metal oxide semiconductor field effect transistor (NMOSFET) that includes a drain connected to the power supply voltage, a gate connected to the second terminal of the first switch, and a source connected to an output of the delay element;
a p-channel metal oxide semiconductor field effect transistor (PMOSFET) that includes a drain connected to a ground potential, a gate for receiving an input to the delay element, and a source connected to the second terminal of the first switch;
a second switch that includes a first terminal connected to the source of the PMOSFET, a second terminal connected to the ground potential, and a reset input for receiving a reset signal;
a third switch that includes a first terminal connected to the source of the NMOSFET, a second terminal, and an enable input for receiving the enable signal;
a second current source that includes a first terminal connected to the second terminal of the third switch and a second terminal connected to the ground potential; and
a fourth switch that includes a first terminal connected to the source of the NMOSFET, a second terminal connected to the ground potential, and a reset input for receiving the reset signal.

13. The method of claim 10, wherein the coarse converter and node selector is comprised of:
a differential voltage and polarity generator; and
a zone encoder and node selector connected to the differential voltage and polarity generator.

14. The method of claim 13, wherein the differential voltage and polarity generator is comprised of a resistive averaging string.

15. The method of claim 10, wherein the fine converter is comprised of:
   a multiplexer array;
   an analog-to-digital (ADC) array connected to the multiplexer array; and
   a time processor connected to the ADC array.

16. The method of claim 15, wherein the ADC array is comprised of a first successive approximation ADC (SAR ADC) and a second SAR ADC.

17. The method of claim 15, wherein the time processor calculates a time for the zero-crossing of the first voltage $V_1$ and the second voltage $V_2$ of the delay processor as $((V_1-V_{ref})/(V_1-V_2))\times \tau_{res\_coarse}$, wherein $V_{ref}$ is an offset voltage and $\tau_{res\_coarse}$ is a coarse conversion resolution.

18. The apparatus of claim 15, wherein the time processor calculates a time for the zero-crossing of the first voltage $V_1$ and the second voltage $V_2$ of the delay processor as $(V_1/(V_1-V_2))\times \tau_{res\_coarse}-\tau$, wherein $V_{ref}$ is an offset voltage, $\tau_{res\_coarse}$ is a coarse conversion resolution, and $\tau$ is an offset time.

19. A method of manufacturing a time-to-digital converter (TDC), comprising:
   forming the TDC on a wafer or a package with at least one other TDC, wherein the TDC includes a delay processor, a coarse converter and node selector connected to the delay processor and configured to select a first voltage $V_1$ and a second voltage $V_2$ of opposite polarities of adjacent stages of the delay processor, a fine converter connected to the coarse converter and node selector and configured to determine a zero-crossing time associated with the first voltage $V_1$ and the second voltage $V_2$, and an encoder connected to the coarse converter and the fine converter and configured to receive and encode the first voltage $V_1$, the second voltage $V_2$ and the zero-crossing time, wherein $V_1$ is a first negative voltage before the zero-crossing time, and $V_2$ is a first positive voltage after the zero-crossing time; and
   testing the TDC, wherein testing the TDC comprises testing the TDC using one or more electrical to optical converters, one or more optical splitters that split an optical signal into two or more optical signals, and one or more optical to electrical converters.

20. A method of constructing an integrated circuit, comprising:
   generating a mask layout for a set of features for a layer of the integrated circuit, wherein the mask layout includes standard cell library macros for one or more circuit features that include a time-to-digital converter (TDC) including a delay processor, a coarse converter and node selector connected to the delay processor and configured to select a first voltage $V_1$ and a second voltage $V_2$ of opposite polarities of adjacent stages of the delay processor, a fine converter connected to the coarse converter and node selector and configured to determine a zero-crossing time associated with the first voltage $V_1$ and the second voltage $V_2$, and an encoder connected to the coarse converter and the fine converter and configured to receive and encode the first voltage $V_1$, the second voltage $V_2$ and the zero-crossing time, wherein $V_1$ is a first negative voltage before the zero-crossing time, and $V_2$ is a first positive voltage after the zero-crossing time;
   disregarding relative positions of the macros for compliance to layout design rules during the generation of the mask layout;
   checking the relative positions of the macros for compliance to layout design rules after generating the mask layout;
   upon detection of noncompliance with the layout design rules by any of the macros, modifying the mask layout by modifying each of the noncompliant macros to comply with the layout design rules;
   generating a mask according to the modified mask layout with the set of features for the layer of the integrated circuit; and
   manufacturing the integrated circuit layer according to the mask.

* * * * *